United States Patent
Takagi

(10) Patent No.: US 9,343,794 B2
(45) Date of Patent: May 17, 2016

(54) MILLIMETER WAVE BANDS SEMICONDUCTOR PACKAGE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/334,888

(22) Filed: Jul. 18, 2014

(65) Prior Publication Data

US 2015/0229015 A1    Aug. 13, 2015

(30) Foreign Application Priority Data

Feb. 7, 2014    (JP) ................... 2014-022065

(51) Int. Cl.
| | |
|---|---|
| *H01L 23/66* | (2006.01) |
| *H01P 3/08* | (2006.01) |
| *H05K 1/02* | (2006.01) |
| *H05K 1/11* | (2006.01) |
| *H05K 1/18* | (2006.01) |

(Continued)

(52) U.S. Cl.
CPC .... *H01P 3/08* (2013.01); *H01L 23/66* (2013.01); *H01P 3/121* (2013.01); *H05K 1/0237* (2013.01); *H05K 1/115* (2013.01); *H05K 1/181* (2013.01); *H01L 2223/6627* (2013.01); *H01L 2223/6633* (2013.01); *H01L 2224/48091* (2013.01); *H01L 2224/48227* (2013.01); *H01L 2924/1903* (2013.01); *H01P 5/107* (2013.01)

(58) Field of Classification Search
CPC ............ H01L 23/66; H01L 2223/6627; H01L 2223/6633; H01L 2924/1903
See application file for complete search history.

(56) References Cited

U.S. PATENT DOCUMENTS

| | | | |
|---|---|---|---|
| 3,008,104 A | 11/1961 | Scapple et al. | |
| 3,103,454 A | 9/1963 | Scapple et al. | |

(Continued)

FOREIGN PATENT DOCUMENTS

| | | |
|---|---|---|
| JP | 62-86841 | 4/1987 |
| JP | 9-26457 | 1/1997 |

(Continued)

OTHER PUBLICATIONS

U.S. Appl. No. 14/334,867, filed Jul. 18, 2014, Takagi.

(Continued)

*Primary Examiner* — Ida M Soward
(74) *Attorney, Agent, or Firm* — Oblon, McClelland, Maier & Neustadt, L.L.P.

(57) ABSTRACT

A millimeter wave bands semiconductor package includes a metal base body, a circuit board, and a metal cover body. The base body has a first non-penetration hole and a second non-penetration hole. The circuit board is disposed on the base body and has an input signal line and an output signal line on a front side surface thereof. The cover body is disposed on the circuit board and has a first penetration hole and a second penetration hole. The cover body is disposed such that the first penetration hole is disposed directly above the first non-penetration hole of the base body and the second penetration hole is disposed directly above the second non-penetration hole of the base body. Further, the first penetration hole and the first non-penetration hole constitute a first waveguide, and the second penetration hole and the second non-penetration hole constitute a second waveguide.

10 Claims, 8 Drawing Sheets

(51) Int. Cl.
*H01P 3/12* (2006.01)
*H01P 5/107* (2006.01)

(56) References Cited

U.S. PATENT DOCUMENTS

| | | | |
|---|---|---|---|
| 5,528,074 A | 6/1996 | Goto et al. | |
| 5,801,528 A | 9/1998 | Katoh et al. | |
| 5,808,519 A * | 9/1998 | Gotoh | H01L 23/66 333/247 |
| 6,040,739 A * | 3/2000 | Wedeen et al. | 330/66 |
| 6,239,669 B1 | 5/2001 | Koriyama et al. | |
| 6,335,669 B1 * | 1/2002 | Miyazaki | H01L 23/66 174/384 |
| 6,369,324 B1 * | 4/2002 | Tomie | 174/650 |
| 6,489,679 B2 * | 12/2002 | Tsukiyama et al. | 257/728 |
| 6,573,803 B1 * | 6/2003 | Ziegner | H01P 5/107 333/26 |
| 6,774,748 B1 * | 8/2004 | Ito | H01L 23/057 257/664 |
| 6,998,708 B2 * | 2/2006 | Ammar | 257/724 |
| 7,106,153 B2 | 9/2006 | Chang et al. | |
| 7,148,765 B2 * | 12/2006 | Tahara | H01P 5/107 333/26 |
| 7,388,450 B2 | 6/2008 | Camiade et al. | |
| 7,439,822 B2 * | 10/2008 | Shimura | H01P 5/08 333/26 |
| 7,573,111 B2 * | 8/2009 | Patel et al. | 257/414 |
| 7,729,129 B2 * | 6/2010 | Shigaki et al. | 361/814 |
| 7,742,307 B2 * | 6/2010 | Ellsworth | H05K 1/0204 361/699 |
| 7,888,797 B2 | 2/2011 | Takagi | |
| 8,072,065 B2 | 12/2011 | Lopez et al. | |
| 8,093,700 B2 * | 1/2012 | Tang | 257/684 |
| 8,256,685 B2 * | 9/2012 | Chen et al. | 235/492 |
| 8,319,689 B2 * | 11/2012 | Kim | H01Q 1/48 343/700 MS |
| 8,552,304 B2 * | 10/2013 | Masuda | H01L 23/057 17/258 |
| 8,912,634 B2 * | 12/2014 | Danny et al. | 257/664 |
| 2001/0043127 A1 * | 11/2001 | Tanji | 333/26 |
| 2002/0086655 A1 * | 7/2002 | Ammar | H04B 1/03 455/347 |
| 2003/0107459 A1 | 6/2003 | Takahashi et al. | |
| 2004/0080377 A1 | 4/2004 | Chang et al. | |
| 2004/0108922 A1 * | 6/2004 | Ammar | H01L 23/562 333/246 |
| 2004/0203528 A1 * | 10/2004 | Ammar et al. | 455/90.3 |
| 2004/0227597 A1 | 11/2004 | Chang et al. | |
| 2005/0017904 A1 * | 1/2005 | Navarro | H01Q 21/065 343/700 MS |
| 2006/0097818 A1 | 5/2006 | Camiade et al. | |
| 2006/0097819 A1 | 5/2006 | Lo Hine Tong et al. | |
| 2007/0007647 A1 | 1/2007 | Takagi | |
| 2009/0206473 A1 | 8/2009 | Lopez et al. | |
| 2010/0038775 A1 | 2/2010 | Camiade et al. | |
| 2010/0244054 A1 * | 9/2010 | Ogihara | H01L 33/02 257/79 |
| 2010/0308925 A1 * | 12/2010 | Song et al. | 331/96 |
| 2010/0315799 A1 | 12/2010 | Suzuki | |
| 2011/0057853 A1 * | 3/2011 | Kim et al. | 343/843 |
| 2011/0234472 A1 * | 9/2011 | Maurer et al. | 343/904 |
| 2012/0139099 A1 | 6/2012 | Lopez et al. | |
| 2012/0248587 A1 | 10/2012 | Alleaume et al. | |
| 2014/0070904 A1 * | 3/2014 | Cahill et al. | 333/135 |
| 2014/0168024 A1 * | 6/2014 | Lee | H01Q 13/06 343/767 |
| 2015/0137336 A1 * | 5/2015 | Kawamura et al. | 257/664 |

FOREIGN PATENT DOCUMENTS

| | | |
|---|---|---|
| JP | 10-65038 | 3/1998 |
| JP | 10-173403 A | 6/1998 |
| JP | 10-303613 | 11/1998 |
| JP | 2000-151222 | 5/2000 |
| JP | 2000-244211 | 9/2000 |
| JP | 2001-267814 | 9/2001 |
| JP | 2001-284476 | 10/2001 |
| JP | 3464118 | 11/2003 |
| JP | 3485520 | 1/2004 |
| JP | 2006-507740 | 3/2006 |
| JP | 2006-237967 | 9/2006 |
| JP | 4575247 B2 | 11/2010 |
| JP | 2011-120155 | 6/2011 |
| JP | 2012-69647 | 4/2012 |
| KR | 10-2005-0055204 | 6/2005 |
| KR | 10-1200813 B1 | 11/2012 |
| TW | 200406081 A | 4/2004 |
| TW | 200943616 A1 | 10/2009 |

OTHER PUBLICATIONS

U.S. Appl. No. 14/334,791, filed Jul. 18, 2014, Takagi.
U.S. Appl. No. 14/458,390, filed Aug. 13, 2014, Takagi.
Office Action issued Sep. 4, 2015 in Korean Patent Application No. 10-2014-0116103 (with English language translation).
Office Action issued Sep. 4, 2015 in Korean Patent Application No. 10-2014-0116102 (with English language translation).
Office Action issued Sep. 4, 2015 in Korean Patent Application No. 10-2014-0116105 (with English language translation).
Extended European Search Report issued Jul. 15, 2015 in Patent Application No. 14181195.0.
Extended European Search Report issued Jul. 27, 2015 in Patent Application No. 14177700.3.
Extended European Search Report issued Jul. 27, 2015 in Patent Application No. 14177873.8.
Extended European Search Report issued Jul. 27, 2015 in Patent Application No. 14177701.1.
Office Action issued Oct. 22, 2015 in Taiwanese Patent Application No. 103127753.

* cited by examiner

MILLIMETER WAVE BANDS SEMICONDUCTOR PACKAGE

CROSS REFERENCE TO RELATED APPLICATIONS

This application is based upon and claims the benefit of priority from the prior Japanese Patent Application No. 2014-022065 filed in Japan on Feb. 7, 2014; the entire contents of which are incorporated herein by reference.

FIELD

Embodiments described herein relate generally to a millimeter wavebands semiconductor package and a millimeter wave bands semiconductor device.

BACKGROUND

A conventional millimeter wave bands semiconductor package, on which a semiconductor chip operating in such a millimeter wave bands of 30 GHz or higher is mounted, includes a base body on which the semiconductor chip is placed, a signal line in which one end thereof is connected to the semiconductor chip and the other end acts as an antenna, and a cover body which is provided on the base body to cover the semiconductor chip. Such a conventional millimeter wave bands semiconductor package is used by inserting the signal line into a waveguide which is connected to an external electrical circuit or the like.

However, the conventional millimeter wave bands semiconductor package which was disclosed in Japan Patent Number 3485520 has two waveguide blocks for an input terminal antenna and an output terminal antenna. Since the two waveguide blocks are separate components, the installation states of the waveguide blocks for the antennas are changed at each terminal antenna. Accordingly, there is a problem in that the millimeter wave bands semiconductor package and a millimeter wave bands semiconductor device in which the semiconductor chip is mounted on the package are poor in reproducibility.

DESCRIPTION OF THE EMBODIMENTS

Certain embodiments provide a millimeter wave bands semiconductor package including a metal base body, a circuit board, and a metal cover body. The base body has a first non-penetration hole and a second non-penetration hole. The circuit board is disposed on the base body and has an input signal line and an output signal line on a front side surface thereof. The cover body is disposed on the circuit board and has a first penetration hole and a second penetration hole. The cover body is disposed on the circuit board such that the first penetration hole is disposed directly above the first non-penetration hole of the base body and the second penetration hole is disposed directly above the second non-penetration hole of the base body. Further, the first penetration hole and the first non-penetration hole constitute a first waveguide and the second penetration hole and the second non-penetration hole constitute a second waveguide.

Certain embodiments provide a millimeter wave bands semiconductor device including a metal base body, a circuit board, a metal cover body, and a semiconductor chip. The base body has a first non-penetration hole and a second non-penetration hole. The circuit board is disposed on the base body and has an input signal line and an output signal line on a front side surface of the circuit board. The circuit board has a penetration hole in a part thereof. The cover body is disposed on the circuit board and has a first penetration hole and a second penetration hole. The semiconductor chip is placed on a front side surface of the base body so as to be disposed in the penetration hole of the circuit board and is electrically connected to the input signal line and the output signal line. Here, the cover body is disposed on the circuit board such that the first penetration hole is disposed directly above the first non-penetration hole of the base body and the second penetration hole is disposed directly above the second non-penetration hole of the base body. Further, the first penetration hole and the first non-penetration hole constitute a first waveguide and the second penetration hole and the second non-penetration hole constitute a second waveguide.

A millimeter wave bands semiconductor package and a millimeter wave bands semiconductor device according to embodiments will be described below.

Figure 1:
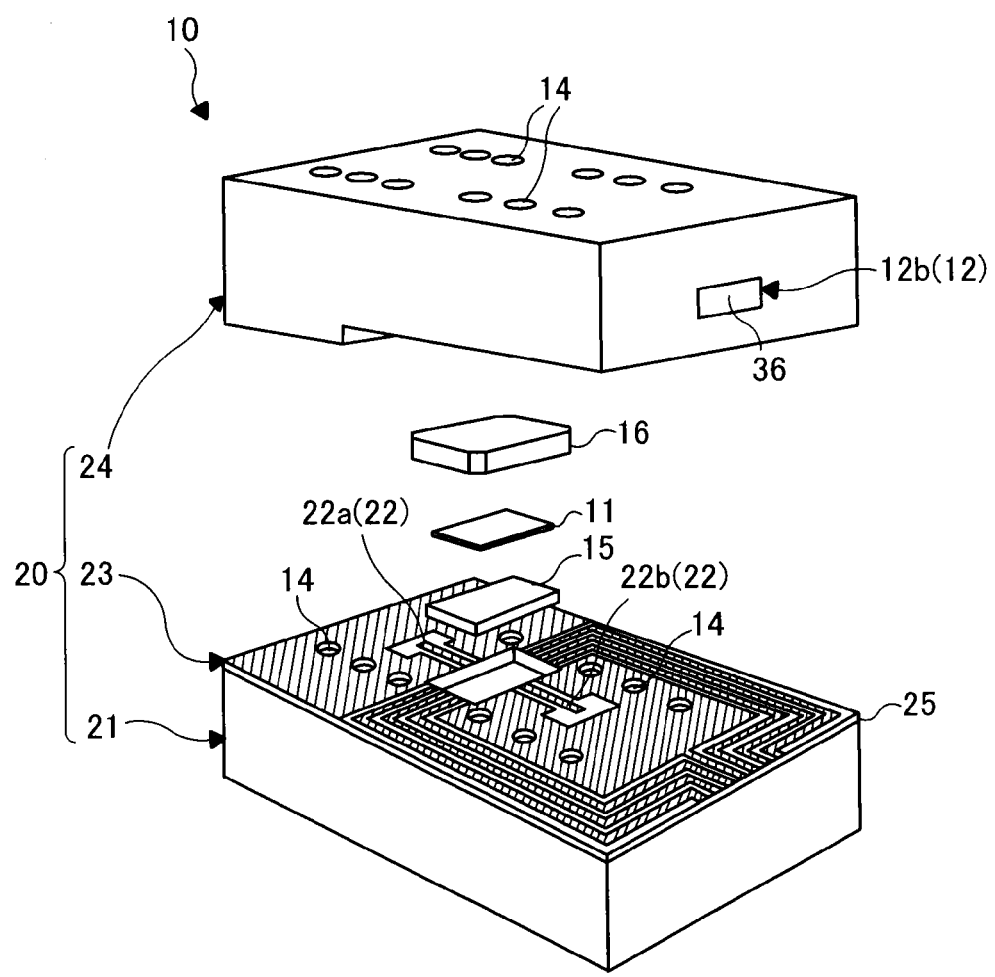
FIG. 1 is an exploded perspective view illustrating schematically a millimeter wave bands semiconductor device according to embodiments when viewed obliquely from above.
Figure 2:
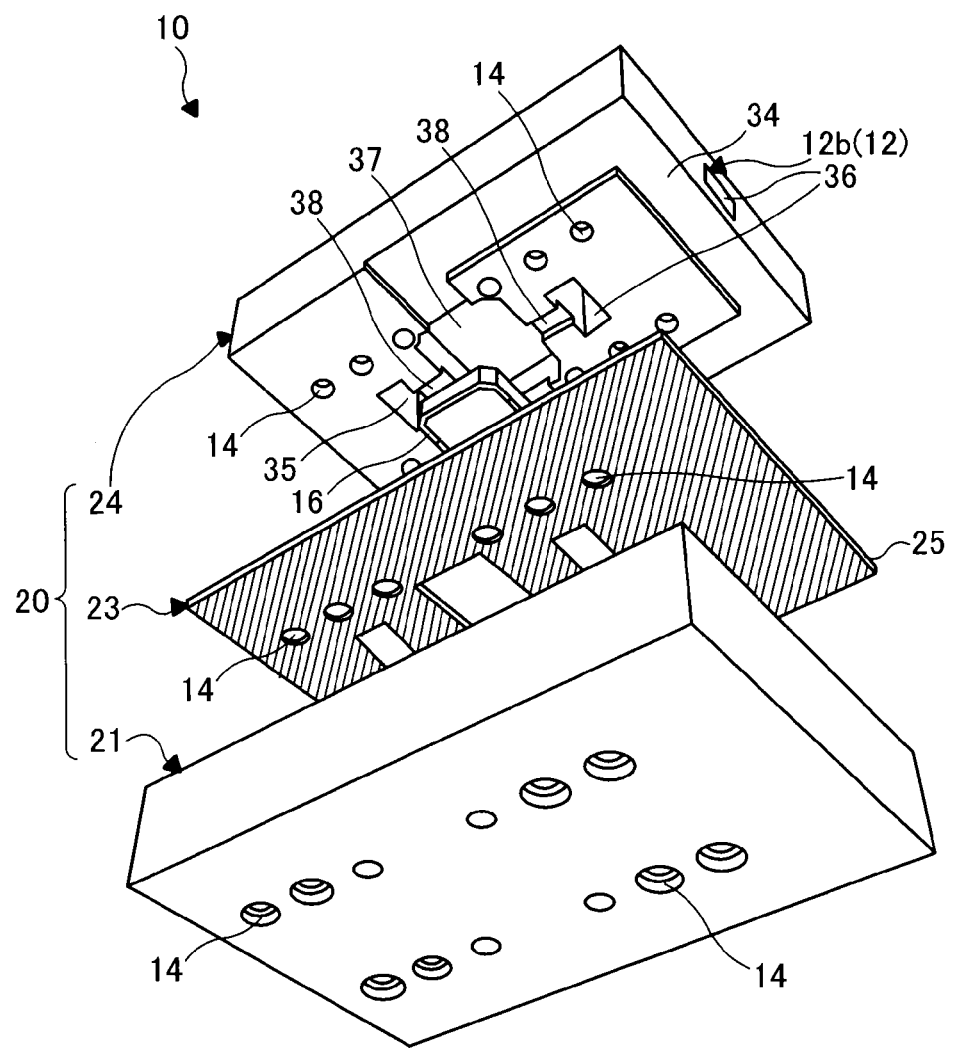
FIG. 2 is an exploded perspective view illustrating schematically the millimeter wave bands semiconductor device according to embodiments when viewed obliquely from below.

FIG. 1 is an exploded perspective view illustrating schematically a millimeter wave bands semiconductor device according to embodiments when viewed obliquely from above. In addition, FIG. 2 is an exploded perspective view illustrating schematically the millimeter wave bands semiconductor device according to embodiments when viewed obliquely from below. As illustrated in FIGS. 1 and 2, in a millimeter wave bands semiconductor device 10 according to the embodiments, a semiconductor chip 11 is mounted inside a millimeter wave bands semiconductor package 20. The millimeter wave bands semiconductor package 20 includes a base body 21, a circuit board 23 provided with signal lines 22 and the like, and a cover body 24.

Each of the base body 21 and the cover body 24 included in the millimeter wave bands semiconductor package 20 is a cuboid metal block. Further, the circuit board 23 is configured such that a desired circuit pattern or the like is formed on a front side surface of a dielectric substrate 25 and a desired pattern is also formed on a back side surface of the dielectric substrate 25.

Such a millimeter wave bands semiconductor package 20 will be described in detail below.

Figure 3A:
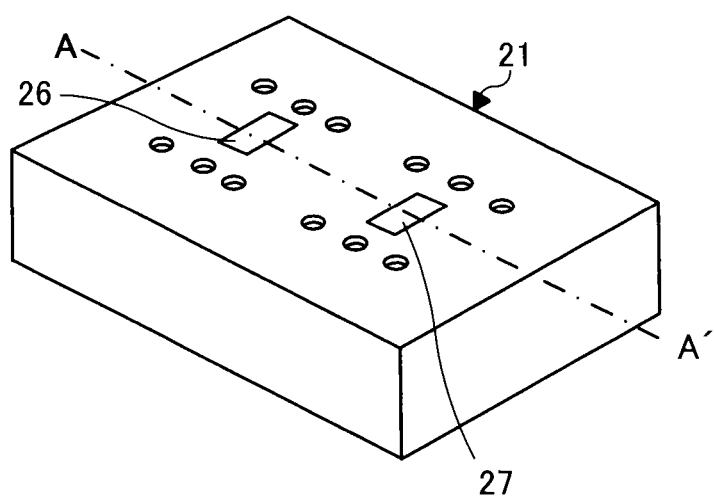
FIG. 3A is a perspective view illustrating schematically a base body of a millimeter wave bands semiconductor package according to embodiments when viewed obliquely from above.

FIG. 3A is a perspective view illustrating schematically the base body 21 of the millimeter wave bands semiconductor package 20 according to the embodiment when viewed obliquely from above. In addition, FIG. 3B is a cross-sectional view illustrating schematically the base body 21 taken along the dashed-dotted line A-A' in FIG. 3A.

Figure 3B:
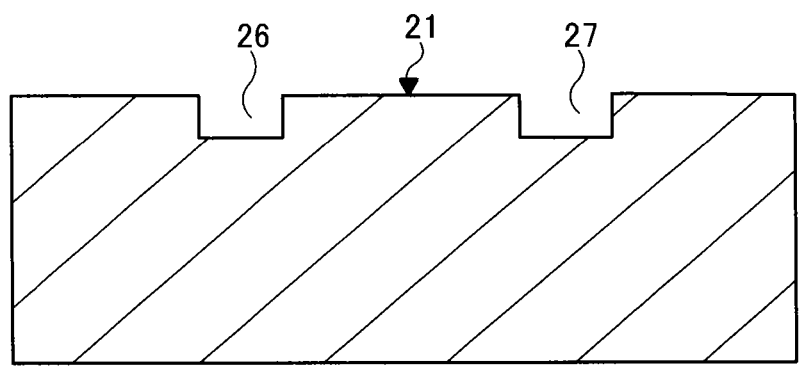
FIG. 3B is a cross-sectional view illustrating schematically the base body taken along the dashed-dotted line A-A' in FIG. 3A.

As illustrated in FIGS. 3A and 3B, a first non-penetration hole 26 and a second non-penetration hole 27 are provided in the cuboid base body 21 as a metal block so as to extend by a predetermined distance toward aback side surface from a front side surface but not to penetrate the base body 21. These non-penetration holes 26 and 27 constitute waveguides 12, through which millimeter waves are guided, together with penetration holes 35 and 36 of the cover body which will be described below.

Further, the predetermined distances of the first non-penetration hole 26 and the second non-penetration hole 27 refer to such a distance that a distance L1 (see FIG. 6) from the front side surface of the circuit board 23 to the bottom surface of the non-penetration holes 26 and 27 becomes $\lambda/4$ (where $\lambda$ is a wavelength of the millimeter wave to be used) when the circuit board 23 is placed on the front side surface of base body 21.

The base body 21 may be made of a metal, but is preferably made of a metal such as Cu having excellent heat conductivity in order to improve radiation performance of heat emitted from the semiconductor chip 11 (see FIGS. 1 and 2) mounted on the front side surface of the base body 21.

Figure 4A:
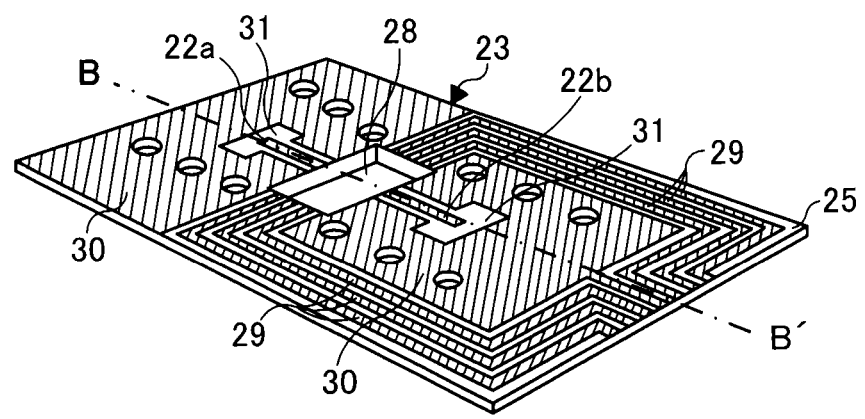
FIG. 4A is a perspective view illustrating schematically a circuit board of the millimeter wave bands semiconductor package according to embodiments when viewed obliquely from above.
Figure 4B:
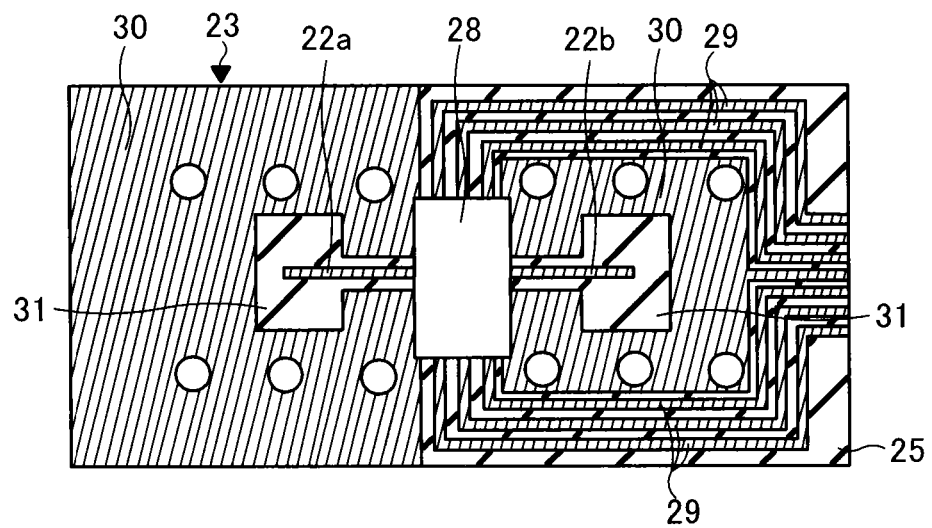
FIG. 4B is a plan view illustrating schematically the circuit board of the millimeter wave bands semiconductor package according to embodiments when viewed obliquely from above.
Figure 4C:
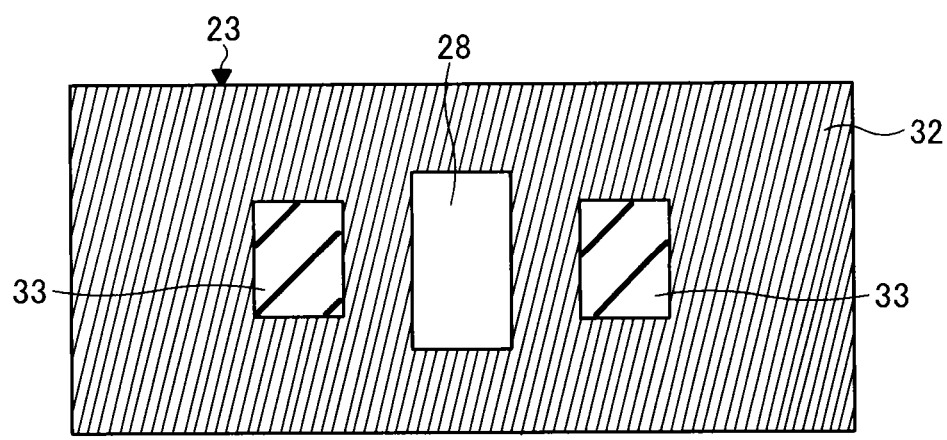
FIG. 4C is a plan view illustrating schematically the circuit board of the millimeter wave bands semiconductor package according to embodiments when viewed obliquely from below.

FIG. 4A is a perspective view illustrating schematically the circuit board 23 of the millimeter wave bands semiconductor package 20 according to the embodiments when viewed obliquely from above. In addition, FIG. 4B is a plan view illustrating schematically the circuit board 23 of the millimeter wave bands semiconductor package 20 according to the embodiments when viewed obliquely from above and FIG. 4C is a plan view illustrating schematically the circuit board 23 of the millimeter wave bands semiconductor package 20 according to the embodiments when viewed obliquely from below. Further, FIG. 4D is a cross-sectional view illustrating schematically the circuit board 23 taken along the dashed-dotted line B-B' in FIG. 4A.

As illustrated in FIGS. 4A to 4D, the circuit board 23 is configured such that a desired circuit pattern or the like is formed on the front side surface of the dielectric substrate 25 and a desired pattern is also formed on the back side surface of the dielectric substrate 25.

The dielectric substrate 25 is formed of, for example, ceramic or the like in a plate shape, and a substantially rectangular penetration hole 28 is provided in a substantially central region of the dielectric substrate 25 to dispose the semiconductor chip 11 or the like.

Figure 4D:
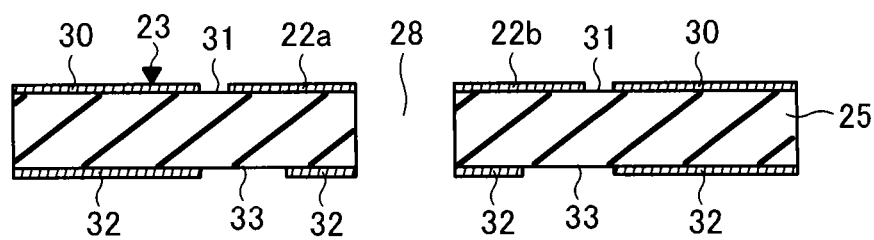
FIG. 4D is a cross-sectional view illustrating schematically the circuit board taken along the dashed-dotted line B-B' in FIG. 4A.

As illustrated in FIGS. 4A, 4B, and 4D, a circuit pattern including input/output signal lines 22a and 23b, a plurality of bias supplying lines 29, and a first ground pattern 30 is provided on the front side surface of the dielectric substrate 25 by a metal thin film, for example, Cu or the like.

The input signal line 22a extends by a predetermined distance toward one side of the dielectric substrate 25 from a long side of the substantially rectangular penetration hole 28, on the front side surface of the dielectric substrate 25. One end of the input signal line 22a receives millimeter waves guided through the waveguide 12 which will be described below. In addition, the other end of the input signal line 22a guides the received millimeter waves to the semiconductor chip 11 which is electrically connected to the other end.

The output signal line 22b extends by a predetermined distance toward a direction opposite to the extending direction of the input signal line 22a from along side of the penetration hole 28 facing the long side which comes in contact with the input signal line 22a, on the front side surface of the dielectric substrate 25. One end of the output signal line 22b receives the millimeter waves guided from the semiconductor chip 11 which is electrically connected to the one end. In addition, the other end of the output signal line 22b transmits the received millimeter waves to the waveguide 12.

Accordingly, the predetermined distances of the input signal line 22a and the output signal line 22b refer to a distance longer than the lengths of these signal lines 22a and 22b which are capable of acting as a monopole antenna for transmitting and receiving the millimeter waves guided through the waveguide 12, respectively.

Each of the plurality of bias supplying lines elongates along a peripheral portion of the dielectric substrate 25 from, for example, a short side of the substantially rectangular penetration hole 28 and extends to come in contact with one side of the dielectric substrate 25, respectively, on the front side surface of the dielectric substrate 25. These bias supplying lines 29 are lines to supply a DC bias to the semiconductor chip 11, respectively.

The first ground pattern 30 is provided on the approximately entire front side surface of dielectric substrate 25 to be insulated from the input signal line 22a, the output signal line 22b, and the plurality of bias supplying lines 29. The first ground pattern 30 is removed in a substantially rectangular shape in the vicinity of one end of the input signal line 22a, and the first ground pattern 30 is removed in a substantially rectangular shape in the vicinity of the other end of the output signal line 22b.

Further, the substantially rectangular front region of the dielectric substrate 25, which is exposed by the removal of the ground pattern 30 in this manner, is a region included in the waveguide to be described below. Therefore, the substantially rectangular front side region of the dielectric substrate 25, which is exposed by the removal of the first ground pattern 30, is referred to as a front side waveguide region 31.

Next, as illustrated in FIGS. 4C and 4D, a second ground pattern 32 is provided on the back side surface of the dielectric substrate 25 by a metal thin film, for example, Cu or the like. The second ground pattern 32 is provided on the approximately entire back side surface of the dielectric substrate 25, but the region corresponding to the front side waveguide region 31 is removed. The ground pattern 30 and the ground pattern 32 are electrically connected to each other by a plurality of through holes (not illustrated in the drawings).

Further, similar to the front side region, the substantially rectangular back side region of the dielectric substrate 25, which is exposed by the removal of the ground pattern 32 in this manner, is also a region included in the waveguide 12 to be described below. Therefore, the substantially rectangular back side region of the dielectric substrate 25, which is exposed by the removal of the second ground pattern 32, is referred to as a back side waveguide region 33.

Figure 5A:
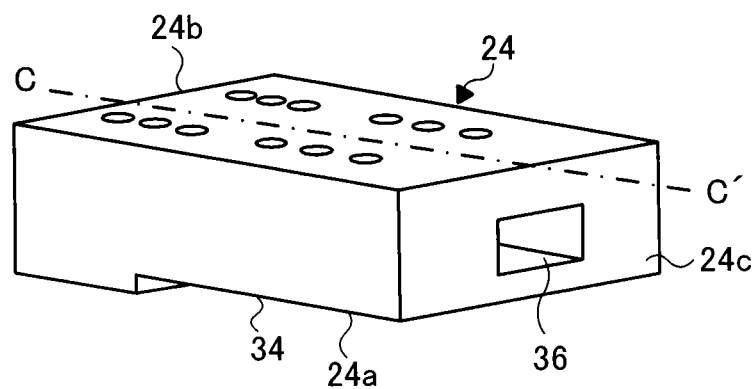
FIG. 5A is a perspective view illustrating schematically a cover body of the millimeter wave bands semiconductor package according to embodiments when viewed obliquely from above.

FIG. 5A is a perspective view illustrating schematically the cover body 24 of the millimeter wave bands semiconductor package 20 according to the embodiments when viewed obliquely from above. In addition, FIG. 5B is a cross-sectional view illustrating schematically the cover body taken along the dashed-dotted line C-C' in FIG. 5A.

Figure 5B:
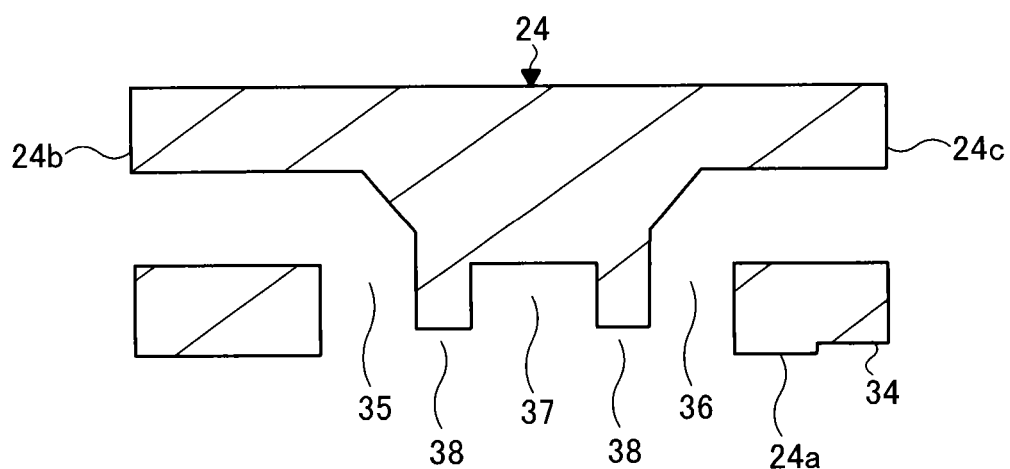
FIG. 5B is a cross-sectional view illustrating schematically the cover body taken along the dashed-dotted line C-C' in FIG. 5A.

The cuboid cover body 24 as the metal block is disposed on the above-described circuit board 23, but, as illustrated in FIGS. 5A, 5B, and 2, respectively, a ring-shaped region 34, which faces the bias supplying line 29, of the back side surface of the cover body 24 is shallowly hollowed out to suppress the contact between the cover body 24 and the bias supplying line 29.

As illustrated in FIGS. 5B and 2, the first penetration hole 35 and the second penetration hole 36 having an L-shape are provided so as to penetrate the cover body 24 toward side surfaces 24b and 24c from a back side surface 24a in the cover body 24 having such a ring-shaped region 34, respectively. The first penetration hole 35 is provided to penetrate the cover body 24 toward the first side surface 24b from the back side surface 24a and the second penetration hole 36 is provided to penetrate the cover body 24 toward the second side surface 24c opposite to the first side surface 24b from the back side surface 24a. Each of the penetration holes 35 and 36 constitutes the waveguide 12, through which the millimeter waves are guided, together with non-penetration holes 26 and 27 of the base body 21.

As illustrated in FIG. 5A, each of the penetration holes 35 and 36 is a penetration hole of a so-called E-plane bend type having a horizontally long shape in cross section, but may be a penetration hole of a so-called H-plane bend type having a vertical long shape in cross section.

Further, as illustrated in FIGS. 5B and 2, in the back side surface 24a of the cover body 24, a first recessed portion 37 is provided between the first penetration hole 35 and the second penetration hole 36 such that the semiconductor chip 11 is disposed and a second recessed portion 38 is provided such that each of the penetration holes 35 and 36 is connected to the first recessed portion 37.

Figure 6:
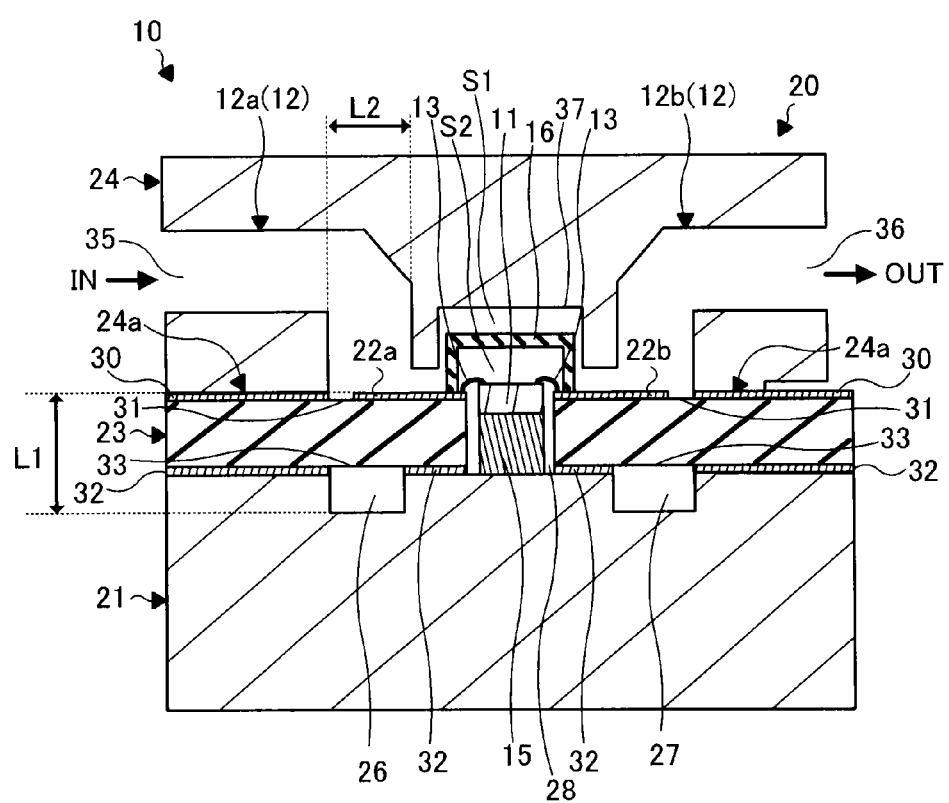
FIG. 6 is a cross-sectional view corresponding to FIGS. 3B, 4D, and 5B illustrating the millimeter wave bands semiconductor device according to embodiments.

FIG. 6 is a cross-sectional view corresponding to FIGS. 3B, 4D, and 5B illustrating the millimeter wave bands semiconductor device 10 in which the semiconductor chip 11 is mounted on the above-described millimeter wavebands semiconductor package 20.

As illustrated in FIG. 6, the circuit board 23 is mounted on the front side surface of the base body such that the back side waveguide regions 33 provided in the back side surface of the circuit board 23 are disposed on atop of the first non-penetration hole 26 and a top of the second non-penetration hole 27 of the base body 21 and the second ground pattern 32 on the back side surface of the circuit board 23 comes in contact with the front side surface of the base body 21. In addition, the cover body 24 is mounted on the circuit board 23 such that the first penetration hole 35 and the second penetration hole 36 are disposed on the front side waveguide regions 31 of the circuit board 23 and the back side surface 24a thereof comes in contact with the first ground pattern 30 on the front side surface of the circuit board 23.

Then, as illustrated in FIGS. 1 and 2, screw holes 14 are provided to penetrate through each of the base body 21, the circuit board 23, and the cover body 24, and the base body 21, the circuit board 23, and the cover body 24 are fixed to each other by insertion of fixing screws into these screw holes 14.

In the millimeter wave bands semiconductor package 20 configured in this manner, the first non-penetration hole 26 of the base body 21 and the first penetration hole 35 of the cover body 24 constitute the first waveguide 12a including the front side waveguide region 31 and the back side waveguide region 33 of the circuit board 23 therein. Similarly, the second non-penetration hole 27 of the base body 21 and the second penetration hole 36 of the cover body 24 constitute the second waveguide 12b including the front side waveguide region 31 and the back side waveguide region 33 of the circuit board 23 therein.

Further, in the millimeter wave bands semiconductor package 20 configured in this manner, the input/output signal lines 22a and 22b of the circuit board 23 are in a state of being inserted into these waveguides 12a and 12b by $L2=\lambda/4$ (where $\lambda$ is a wavelength of the millimeter wave to be used), respectively, to act as a monopole antenna.

The semiconductor chip 11 operating in the millimeter wave is mounted in the above-described millimeter wave bands semiconductor package 20. The semiconductor chip 11 is, for example, a field effect transistor (FET) which amplifies power of the millimeter waves.

The semiconductor chip 11 is mounted on the front side surface of the base body 21 via a metal chip mount plate 15. The semiconductor chip 11 is placed on the front side surface of the base body 21 together with the chip mount plate 15 so as to be disposed in a space S1 which is surrounded substantially by the front side surface of the base plate 21, the side surface of the penetration hole 28 of the circuit board 23, and the first recessed portion 37 of the cover body 24.

Further, a recessed chip cover body 16 formed of, for example, a dielectric material such as ceramic is disposed in the first recessed portion 37 of the cover body 24. Accordingly, in more detail, the semiconductor chip 11 is placed on the front side surface of the base body 21 together with the chip mount plate 15 so as to be disposed in a space S2 which is surrounded substantially by the front side surface of the base plate 21, the side surface of the penetration hole 28 of the circuit board 23, and the chip cover body 16.

The semiconductor chip 11 placed in this manner is electrically connected to the other end of the input signal line 22a of the circuit board 23 by a connection conductor, for example, a wire 13 or the like and is also electrically connected to one end of the output signal line 22b of the circuit board 23 by the connection conductor, for example, the wire 13 or the like.

In the millimeter wave bands semiconductor device 10 in which the semiconductor chip 11 is mounted in the millimeter wave bands semiconductor package 20 in this manner, when the millimeter waves are input into the first waveguide 12a from an arrow IN direction in FIG. 6, the millimeter waves are guided through the first waveguide 12a and received at the input signal line 22a which is inserted and disposed within the first waveguide 12a.

The received millimeter waves are input to the semiconductor chip 11 via the input signal line 22a and are subjected to the desired signal processing (for example, power amplification) in the semiconductor chip 11.

When the signal-processed millimeter waves are output to the output signal line 22b from the semiconductor chip 11, the millimeter waves are transmitted into the second waveguide 12b from the output signal line 22b. The millimeter waves transmitted into the second waveguide 12b are guided through the second waveguide 12b and are output to an arrow OUT direction in FIG. 6.

According to the millimeter wave bands semiconductor package 20 and the millimeter wave bands semiconductor device 10 of the embodiments described above, since the waveguides 12a and 12b, through which the millimeter waves are guided, are embedded in the millimeter wave bands semiconductor package 20, it is possible to provide the millimeter wave bands semiconductor package 20 and the millimeter wave bands semiconductor device 10 in which, for example, a change in relative position between the input/output signal lines 22a and 22b and the waveguides 12a and 12b is suppressed and reproducibility is excellent.

When the relative position between the input/output signal lines 22a and 22b and the waveguides 12a and 12b is shifted by, for example, 0.5 mm, the power loss of the millimeter waves is about 3 dB (about half). Accordingly, the excellent reproducibility and, for example, the arrangement of the input/output signal lines 22a and 22b with high accuracy at a desired position of the waveguides 12a and 12b are very important in the millimeter wave bands semiconductor package 20 and the millimeter wave bands semiconductor device 10.

Further, according to the millimeter wave bands semiconductor package 20 and the millimeter wave bands semiconductor device 10 of the embodiment described above, the first and second penetration holes 35 and 36, which constitute the waveguides 12a and 12b as a main body, are provided in the cover body 24. Accordingly, the back side surface of the base body 21 can be fixed to a cooling mechanism such as a heat radiation fin. As a result, the heat radiation property can be improved.

Moreover, according to the millimeter wave bands semiconductor package 20 and the millimeter wave bands semiconductor device 10 of the embodiment described above, the first and second penetration holes 35 and 36, which constitute the waveguides 12a and 12b as the main body, are provided in the cover body 24. Accordingly, it is possible to provide the millimeter wave bands semiconductor package 20 and the millimeter wave bands semiconductor device 10 in which the heat radiation property is more excellent.

That is, even when the first and second penetration holes, which constitute the waveguides as the main body, are provided in the base body 21 and the first and second non-penetration holes are provided in the cover body 24, it is possible to provide the millimeter wave bands semiconductor package and the millimeter wave bands semiconductor device in which the waveguides 12a and 12b are embedded. However, when the first and second penetration holes, which constitute the waveguides as the main body, are provided in the base body 21 which also acts as a radiation plate of heat emitted from the semiconductor chip 11, the first and second penetration holes restrict a heat radiation path and the heat radiation property is deteriorated.

On the other hand, as the embodiments, when the first and second penetration holes 35 and 36, which constitute the waveguides 12a and 12b as the main body, are provided in the cover body 24, the first and second non-penetration holes 26 and 27 having a volume smaller than the penetration holes 35 and 36 can be provided in the base body 21 and the restriction of the heat radiation path by the provision of the waveguides 12a and 12b can be alleviated, compared with the case described above. Accordingly, it is possible to provide the millimeter wave bands semiconductor package 20 and the millimeter wave bands semiconductor device 10 in which the heat radiation property is more excellent.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 7A:
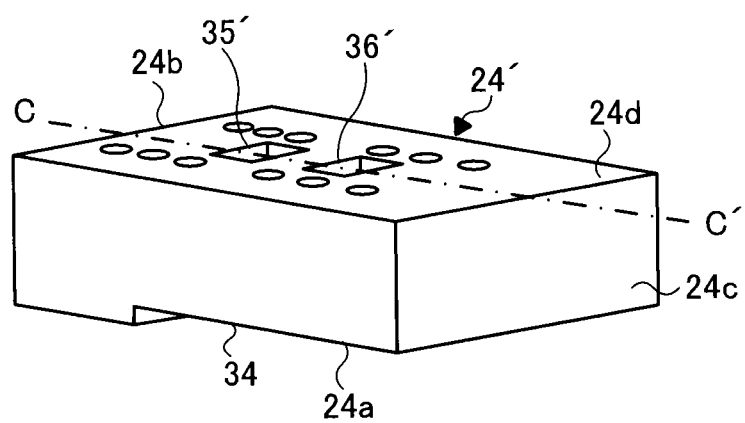
FIG. 7A is a perspective view illustrating schematically a cover body of a millimeter wave bands semiconductor package according to a modified embodiment when viewed obliquely from above.
Figure 7B:
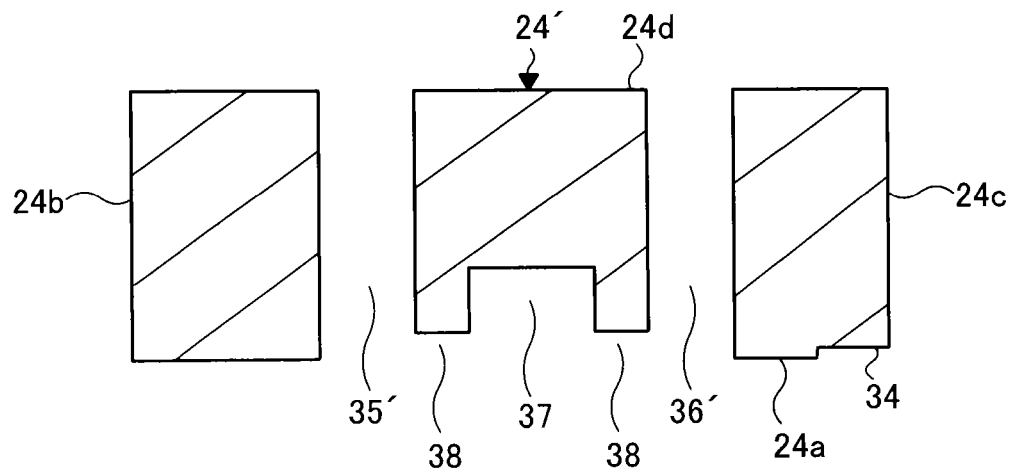
FIG. 7B is a cross-sectional view illustrating schematically the cover body taken along the dashed-dotted line C-C' in FIG. 7A.

For example, as illustrated in FIGS. 7A and 7B, first and second penetration holes 35' and 36' may be provided so as to penetrate a cover body 24' toward a front side surface 24d from the back side surface 24a. Accordingly, even when the first and second penetration holes 35' and 36' are provided in such a way, it is possible to obtain the same effects as in the millimeter wave bands semiconductor package 20 and the millimeter wave bands semiconductor device 10 according to the above-described embodiment.

What is claimed is:

1. A millimeter wave bands semiconductor package comprising:
   a metal base body having a first non-penetration hole and a second non-penetration hole;
   a circuit board that is disposed on the metal base body and that has an input signal line and an output signal line on a front side surface thereof; and
   a metal cover body that is disposed on the circuit board and has a first penetration hole and a second penetration hole,
   wherein the metal cover body is disposed on the circuit board such that the first penetration hole is disposed directly above the first non-penetration hole of the metal base body and the second penetration hole is disposed directly above the second non-penetration hole of the metal base body, and
   the first penetration hole and the first non-penetration hole constitute a first waveguide and the second penetration hole and the second non-penetration hole constitute a second waveguide.

2. The millimeter wave bands semiconductor package according to claim 1, wherein each of the first penetration hole and the second penetration hole of the metal cover body is a penetration hole bending into L-shaped which penetrates the metal cover body toward a side surface from a back side surface.

3. The millimeter wave bands semiconductor package according to claim 1, wherein each of the first penetration hole and the second penetration hole of the metal cover body is a penetration hole which penetrates the metal cover body toward a front side surface from a back side surface.

4. The millimeter wave bands semiconductor package according to claim 1, wherein one end of the input signal line is inserted by a length of $\lambda/4$ into the first waveguide, and
   one end of the output signal line is inserted by a length of $\lambda/4$ into the second waveguide.

5. The millimeter wave bands semiconductor package according to claim 1, wherein the first non-penetration hole is provided such that a bottom surface thereof is spaced downward by a length of $\lambda/4$ apart from the input signal line, and the second non-penetration hole is provided such that a bottom surface thereof is spaced downward by a length of $\lambda/4$ apart from the output signal line.

6. The millimeter wave bands semiconductor package according to claim 1, wherein a bias supplying line is further provided on the front side surface of the circuit board to supply a DC bias to a semiconductor chip, and
a region, which faces the bias supplying line, of a back side surface of the metal cover body is hollowed out so as to be shallower than the other region.

7. The millimeter wave bands semiconductor package according to claim 6, wherein a first ground pattern is provided on the front side surface of the circuit board, and
the first ground pattern is provided so as to be insulated from the input signal line, the output signal line, and the bias supplying line.

8. The millimeter wave bands semiconductor package according to claim 7, wherein the first ground pattern is not provided in the first waveguide and the second waveguide.

9. The millimeter wave bands semiconductor package according to claim 8, wherein a second ground pattern is provided on a back side surface of the circuit board so as to be electrically connected to the first ground pattern.

10. The millimeter wave bands semiconductor package according to claim 9, wherein the second ground pattern is provided on an entire surface of the back side surface of the circuit board excluding regions which are disposed in the first waveguide and the second waveguide.

* * * * *